United States Patent
Xu et al.

(10) Patent No.: US 7,132,656 B2
(45) Date of Patent: Nov. 7, 2006

(54) HIGH SPEED AND HIGH EFFICIENCY SI-BASED PHOTODETECTORS USING WAVEGUIDES FORMED WITH SILICIDE FOR NEAR IR APPLICATIONS

(75) Inventors: Dan-Xia Xu, Gloucester (CA); Siegfried Janz, Gloucester (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 10/943,992

(22) Filed: Sep. 20, 2004

(65) Prior Publication Data

US 2005/0029455 A1    Feb. 10, 2005

Related U.S. Application Data

(62) Division of application No. 10/021,081, filed on Dec. 19, 2001, now Pat. No. 6,815,245.

(60) Provisional application No. 60/257,285, filed on Dec. 26, 2000.

(51) Int. Cl.
*H01L 31/00* (2006.01)

(52) U.S. Cl. ............ 250/338.4; 257/431; 257/443; 257/449; 438/48; 385/129; 385/132

(58) Field of Classification Search ......... 250/338.4; 257/431, 443, 448, 449, 454, 455, 456; 385/129, 385/132, 39, 40; 438/48, 98, 57
See application file for complete search history.

(56) References Cited

U.S. PATENT DOCUMENTS 4,857,973 A * 8/1989 Yang et al. .............. 257/73

| 5,589,704 A |  | 12/1996 | Levine |
| 5,958,505 A | * | 9/1999 | Mantl ............ 438/225 |
| 6,374,001 B1 |  | 4/2002 | Bozeat et al. |
| 6,553,157 B1 |  | 4/2003 | Schultz et al. |

FOREIGN PATENT DOCUMENTS

| JP | 02003031790 | 1/2003 |
| JP | 2003031790 A * | 1/2003 |

OTHER PUBLICATIONS

Soref, Richard, "Silicon Based Photonic Devices," 1995, IEEE, International Solid State Circuits Conference, pp. 66-67.*
Loken, M. et al., "Fabrication of ultrafast Si based MSM photodetector", Electronics Letters, vol. 34, No. 10, May 14, 1998. pp. 1027-1028.

(Continued)

*Primary Examiner*—Otilia Gabor
*Assistant Examiner*—Christine Sung
(74) *Attorney, Agent, or Firm*—Marks & Clerk; S. Mark Budd

(57) ABSTRACT

According to this invention, silicon-based photodetectors using waveguides formed with silicide regions can have high speed and high efficiency for near IR applications. Utilizing the unique properties of silicides, the proposed method provides a simple and elegant way to implement a photodetector design in which photogenerated carriers travel perpendicular to the direction of light propagation. Therefore, the speed and quantum efficiency of the photodetector may be optimized independently. This device configuration may be implemented in one of the two approaches: (a) waveguides formed through surface silicidation of a silicon-based layer of a substrate (b) waveguides formed through silicidation of ridge waveguide side-walls of a silicon-based layer of a substrate; The use of mature silicon technology promises low cost of production and other benefits.

5 Claims, 5 Drawing Sheets

OTHER PUBLICATIONS

Carline, R.T. et al., "A Vertical Cavity Longwave Infrared SiGe/Si Photodetector Using a Buried Silicide Mirror", Defence Evaluation and Research Agency, pp. 36.1.1-36.1.4.

"Selective Epitaxial Growth Si Resonant-Cavity Photodetector", IEEE Photonics Technology Letters, vol. 10, No. 1, Jan. 1998, pp. 129-131.

Yoshimoto, T. et al., "SOI waveguide GeSi avalanche pin photodetector at 1.3 um wavelength", IEICE Trans. Electron, vol. E81, No. 10, Oct. 10, 1998, pp. 1667-1669.

Honkanen, K. et al., "High-speed metal-semiconductor-metal photodetectors fabricated on SOI-substrates", Physica Scripta, vol. T79, 1999, pp. 127-130.

Liu, M.Y. et al., "140-GHz metal-semiconductor-metal photodetectors on silicon-on-insulator substrate with a scaled active layer", Appl. Phys. Lett. 65 (7), Aug. 15, 1994.

Wang, C. et al., "Comparison of the picosecond characteristics of silicon and silicon-on-sapphire metal-semiconductor-metal photodiodes", Laboratory for Laser Energetics and Department of Electrical Engineering, 1994, pp. 3578-3580.

Kesan, et al., Integrated Waveguide-Photodetector Using Si/SiGe Multiple Quantum Wells For Long Wavelength Applications, 1990 IEEE IEDM 90-637 to 90-639.

Matsuura et al., Optoelectronic Conversion Through 850nm Band Single Mode Si3N4 Photonic Waveguides For Si-On-Chip Integration.

Tong et al., IOS-A New Type of Materials Combination For System-On-A-Chip Preparation, 1999 IEEE, International SOI Conference, Oct. 1999.

Hurrich et al., SOI-CMOS Technology With Monolithically Integrated Active and Passive RF Devices on High Resistivity SIMOX Substrates, Proceedings 1996 IEEE International SOI Conference, Oct. 1996.

Caviglia et al., Microwave Performance of SOI n-MOSFET's and Coplanar Waveguides, IEEE Electron Device Letters, vol. 12, No. 1, Jan. 1991.

Masini et al., Near-infrared Waveguide Photodetectors Based on Polycrystalline Ge on Silicon-on-insulator Substrates, Elsevier, Optical Materials 17 (2001) pp. 243-246.

Diaz et al., Si/SiO2 Resonant Cavity Photodetector, App. Phys. Lett. 69 (19), Nov. 4, 1996, pp. 2798-2800.

* cited by examiner

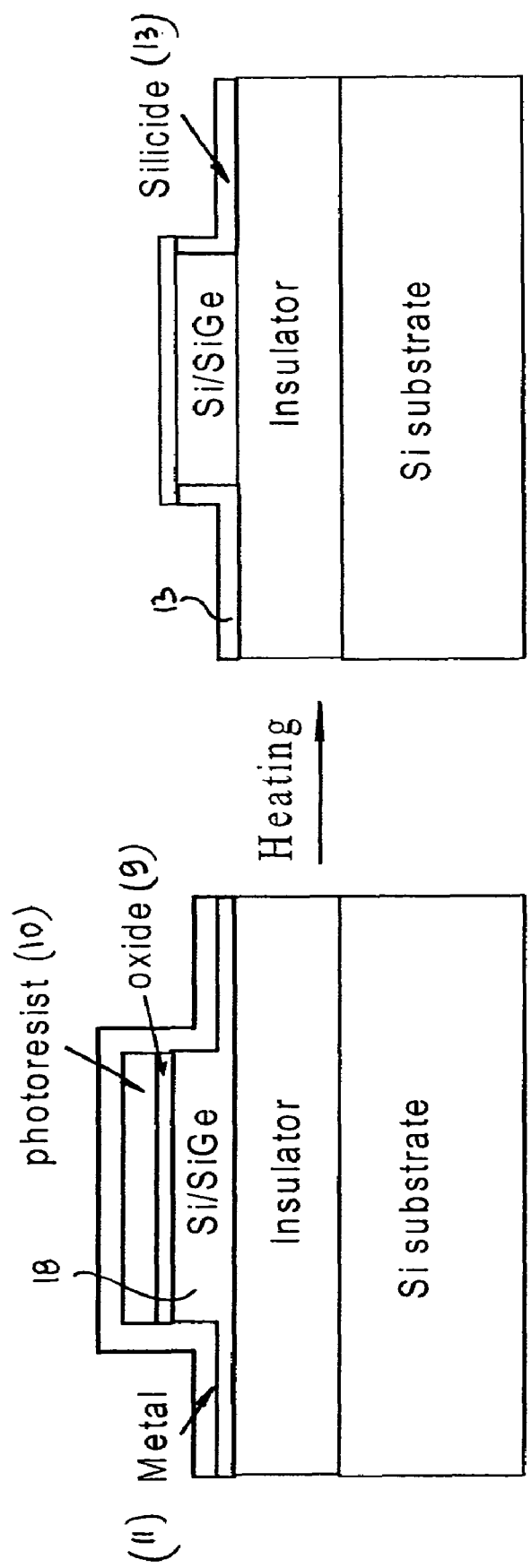

HIGH SPEED AND HIGH EFFICIENCY SI-BASED PHOTODETECTORS USING WAVEGUIDES FORMED WITH SILICIDE FOR NEAR IR APPLICATIONS

This application claims the benefit of U.S. Provisional Application No. 60/257,285, filed Dec. 26, 2000.

FIELD OF THE INVENTION

This invention pertains to the field of semiconductor photodetectors, and in particular, to Si-based photodetectors enhanced by implementation of silicide waveguides for high speed and high quantum efficiency light detection.

BACKGROUND OF THE INVENTION

High-speed detectors and detector arrays are required for telecommunication systems, for high-capacity local area networks, and for instrumentation. For chip-to-chip or processor-to-processor data exchange, optical interconnects will eventually replace today's electrical methods. Many such approaches are being explored. As the number of detectors required for each application increases, low material cost, mature fabrication technology and compact design present many advantages. Compared to detectors requiring surface normal coupling, waveguide detectors are simpler to assemble.

Traditionally photodetectors with high speed and high quantum efficiency have been limited to materials with direct band-gap, such as III–V compounds. It is desirable to fabricate such devices with silicon-based materials, to benefit from the low cost and mature silicon technology. Because the light absorption in the near IR range for silicon (Si) is low it is necessary to uncouple the optical path length (quantum efficiency factor) and the distance between electrodes (speed limit factor).

Metal-semiconductor-metal (MSM) detectors are often proposed as an alternative for high-speed operation, as the speed is primarily limited by the transit time between electrodes. The distance between photodetector electrodes can be scaled down through fine line lithography. MSM detectors are described in the following publications: "140 GHz metal-semiconductor-metal photodetectors on silicon-on-insulator substrate with a scaled active layer", M. Y. Liu, E. Chen, and S. Y. Chou, Appl. Phys. Lett. 65(7), p. 887, 1994; "High-speed metal-semiconductor-metal photodetectors fabricated on SOI-substrates", K. Honkanen, N. Hakkarainen, K. Määttä, A. Kilpelä and P. Kuivalainen, Physica scripta T79, p. 127, 1999; "Comparison of the picosecond characteristics of silicon and silicon-on-sapphire metal-semiconductor-metal photodiodes", C. C. Wang, S. Alexandrou, D. Jacobs-Perkins, and T. Y. Hsinag, Appl. Phys. Lett. 64(26), p.3578, 1994. The contents of the aforementioned publications are incorporated here in by reference.

To increase the optical path length, and therefore the quantum efficiency, several approaches have been explored. Waveguide geometries, often formed on silicon-on-insulator (SOI) substrates as silicon ridges, have been used, as described in "SOI waveguide GeSi avalanche pin photodetector at 1.3 μm wavelength", T. Yoshimoto, S. G. Thomas, K. L. Wang and B. Jalali, IEICE Trans. Electron., E81-C (10), p. 1667, 1998, and "Near-infrared waveguide photodetectors based on polycrystalline Ge on silicon-on-insulator substrates" G. Masini, L Colace, G. Assanto, Optical Materials 17 (2001) 243–246, incorporated here in by reference. The collection of carriers is accomplished either by forming MSM structures on the surface of the ridge waveguides, or by grown-in pin structures.

Another approach is to use vertical cavity structures, which consist of a thin absorbing layer sandwiched between two mirrors. In the past, vertical cavities have been used successfully to build high speed, high quantum efficiency photodetectors. The mirrors were made of dielectric/silicon or Si/SiGe multi-layers through deposition. This method is described in the following publications: "Selective epitaxial growth Si resonant cavity photodetector", G. W. Neudeck, J. Denton, J. Qi, J. D. Schaub, R. Li and J. C. Campbell, IEEE Photo. Technol. Lett. 10(1), p. 129 (1998) and "Si/SiO$_2$ resonant cavity photodetector", D. C. Diaz, C. L. Schow, Jieming Qi, J. C. Campbell, J. C. Bean and L. J. Peticolas, Appl. Phys. Lett. 69(19), p. 2798 (1996).

Buried silicide layers, embedded by wafer bonding or implant, have also been used as mirror material for vertical cavities, as described in: "A vertical cavity longwave infrared SiGe/Si photodetector using a buried silicide mirror," R. T. Carline, D. A. O. Hope, V. Nayar, D. J. Robins and M. B. Stanaway, Technique Digest of IEDM'97, p. 36.1.1 (1997) and in "Fabrication of ultra-fast Si-based MSM photodetector," M. Löken, L., S. Mantel and Ch. Buchal, Electron. Lett. 34 (10), p. 1027, 1998. The contents of the aforementioned publications are incorporated here in by reference.

However, the devices described in the prior art present several limitations described below.

In the case of MSM detectors, only the photocarriers generated near the electrodes (i.e. near the surface) can be collected through drift in the electric field. For carriers generated outside the electric field, a portion of the carriers can be collected through diffusion rather that drift, resulting in a reduction in speed. Forming MSM structures on SOI substrates with thin silicon layers may eliminate this problem. However, the responsivity becomes very low.

Waveguide structures with vertical pin junctions require a specific layer sequence, therefore are costly to make and can limit the possibilities for component integration.

For the vertical cavity structures, light is coupled in from the surface normal direction, and these detectors operate only at a set of discrete resonant wavelengths. The resonant wavelength is determined by the distance between the two mirror surfaces. To obtain high quantum efficiency at the designed wavelength, stringent control in layer thickness is required, which often is a challenge in itself.

In view of the potential advantages of a Si-based photodetector, it would be very advantageous to provide a relatively simple Si-based photodetector with high quantum efficiency and fast response. This application discloses such is a photodetector.

SUMMARY OF THE INVENTION

It has been long desired to design photodetectors in which photogenerated carriers travel perpendicular to the direction of the light propagation, so that speed and quantum efficiency may be optimized independently. Utilizing the unique properties of silcides, the proposed method provides a simple and elegant way to implement such designs.

The first aspect of the invention is a photodetector comprising two separated silicide regions on a substrate and a waveguide of a silicon-based material formed between sidewalls of the two silicide regions.

The second aspect of the invention is a photodetector comprising two separated silicide regions on a substrate and a wavegnide of a silicon-based material formed between side-walls of the two silicide regions, wherein the silicon-based material is one of a group of materials comprising: silicon, amorphous silicon, silicon germanium, and amorphous silicon germanium.

The third aspect of the invention is a photodetector comprising two separated silicide regions on a substrate and a waveguide of a silicon-based material formed between side-walls of the two silicide regions, wherein the two silicide regions are produced using a metal from a group of metals comprising: nickel, platinum, tungsten, and cobalt.

The fourth aspect of the invention relates to a surface silicidation method of producing a photodetector having a waveguide of a silicon-based material, comprising steps of:

a/ depositing a metal layer on a silicon-based material layer of a substrate;

b/ etching to selectively remove unwanted regions of the metal layer; and c/ heating the metal layer to induce a metal-silicon reaction to produce at least two separated silicide regions, the silicide regions forming the waveguide of silicon-based material therebetween.

The fifth aspect of the invention relates to a ridge side-walls silicidation method of producing a photodetector having a waveguide of a silicon-based material, comprising steps of:

a/ forming a ridge in the silicon-based material layer of a substrate and applying a mask on top of the ridge;

b/ depositing a metal layer on the silicon-based material layer of the substrate;

c/ heating the metal layer to induce a metal-silicon reaction to produce at least two separated silicide regions, the silicide regions forming the waveguide therebetween; and d/ etching to selectively remove unwanted metal from the mask without affecting the silicide regions.

BRIEF DESCRIPTION OF THE DRAWINGS

FIG. 1a is a cross-section view of a SOI wafer before a silicidation process.

FIG. 1b is a cross-section view of a SOI wafer after the silicidation process.

FIG. 1c is a top view of the silicon-based photodetector with silicide waveguides.

FIGS. 2a–b, 3a–b, and 4a–b relate to the silicon-based material ridge side-walls silicidation process.

FIG. 2a is a cross-section view of a SOI wafer with a silicon ridge waveguide before the silicidation process.

FIG. 2b is a cross-section view of a SOI wafer as in FIG. 2a after the silicidation process.

FIG. 3a is a cross-section view of a Si substrate or CMOS circuits with an amorphous Si-based material ridge waveguide before the silicidation process.

FIG. 3b is a cross-section view of a Si substrate or CMOS circuits as in

FIG. 3a after the silicidation process.

FIG. 4a is a cross-section view of a Si substrate with a Si/SiGe based material ridge waveguide before the silicidation process.

FIG. 4b is a cross-section view of a Si substrate as in FIG. 4a after the silicidation process.

DESCRIPTION OF THE PREFERRED EMBODIMENTS

Figure 1A:
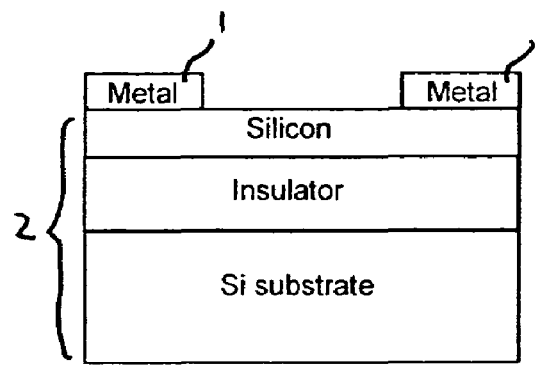
FIGS. 1a–c relate to the surface silicidation process.
Figure 1B:
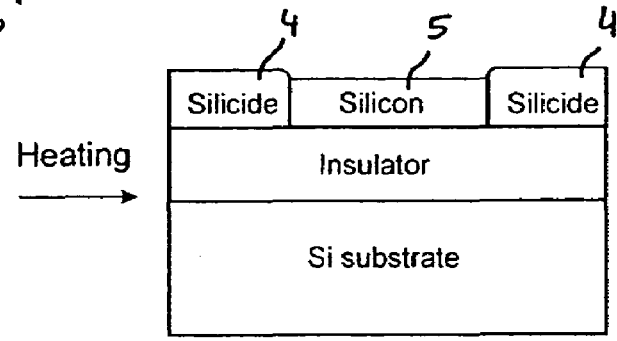
Figure 1C:
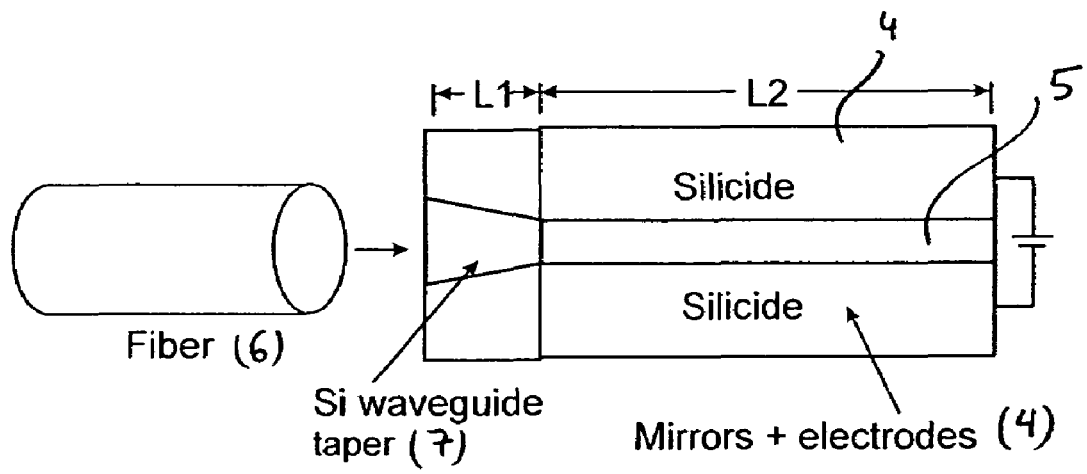

The invention of this application may be implemented by using the following two approaches:

(A) Waveguides Formed Through Surface Silicidation on a SOI Substrate (FIG. 1a–c)

A metal layer 1 is first deposited on a SOI wafer 2. The unwanted regions of the metal are removed through etching techniques. The wafer is then heated in an atmosphere such as nitrogen. During the first stage of the heating process lasting approximately 90 seconds the initial temperature is approximately 400° C. and is gradually raised to 475° C. During the next stage the wafer is heated at approximately 550° C. for two minutes. Under such conditions the chosen metal, currently platinum, nickel, tungsten, or cobalt, reacts with the top silicon layer 3 of the SOI wafer 2 and forms silicide regions 4. The metal thickness can be tuned to consume the entire depth (usually up to 1 µm) of the silicon layer 3. The silicon region 5 bound by the inner side-walls of the silicide regions 4 becomes a waveguide in the lateral direction, with the side-walls acting as mirrors between which light is confined. Light coming from a fiber-optic cable 6 is coupled in from side facets. A tapered input waveguide 7 may also be incorporated to improve the coupling efficiency.

Since silicides are metals with high conductivity, they can also serve as electrodes (FIG. 1c). For photodetector applications, the silicon layer should be lightly n-type doped. The silicide should possess sufficiently large Schottky barrier height to form a Schottky contact with silicon. Several types of silicides, such as platinum silicide (PtSi) and nickel silicide (NiSi), as well as silicides of tungsten (W) and cobalt (Co), could serve this purpose. The photo carriers generated are collected by the silicide regions acting as electrodes. When the distance between the mirrors is small enough (about 1 µm), the silicon layer between the electrodes is fully depleted under moderate bias. The transit time is therefore limited only by the distance between the electrodes and the saturation velocity in silicon. As the entire volume of active silicon can be biased into depletion, this photodetector does not suffer from the diffusion time limitation of conventional MSM detectors.

Figures 2A, 2B:
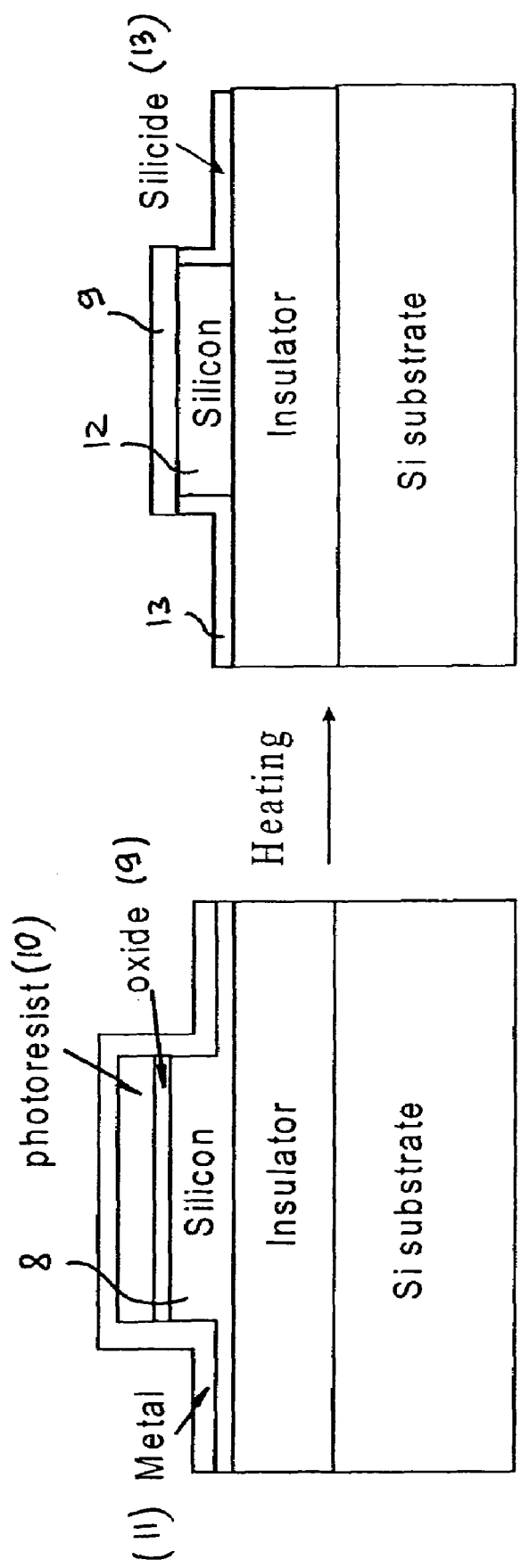

(B) Waveguides Formed Through Silicidation of Ridge Waveguide Side-Walls on a SOI Substrate (FIG. 2a–b)

A silicon ridge waveguide 8 is formed on a SOI substrate 2. Silicon dioxide ($SiO_2$) layer 9 and photoresist layer 10 are applied on its top surface as an etching mask (FIG. 2a). Next, a layer of metal 11 is deposited on the surface of the wafer and the sample is subjected to a silicidation process similar to that described in approach (A). Since the metal 11 on top of the ridge is separated from silicon by the $SiO_2$ layer 9 it does not become silicide. It can be removed by selective etching solutions, which etch the metal but do not etch the silicides. The L-shaped silicide regions 13 at both sides of the waveguide 12 are now electrically isolated (FIG. 2b). Small separation between the electrodes can be easily achieved. As discussed above, the silicide regions serve both as mirrors and electrodes. This method is more suitable for structures with thicker silicon layers.

Figures 3A, 3B:
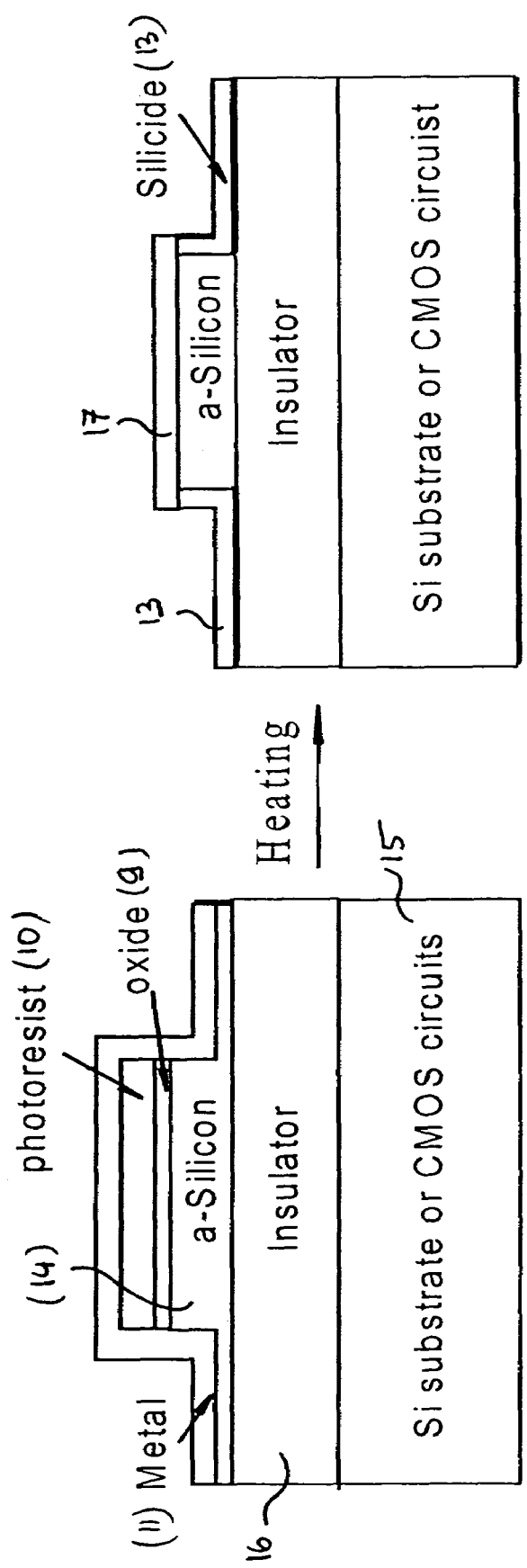

Approaches (A) and (B) may also be implemented with amorphous silicon-based material (FIG. 3a–b). The amorphous silicon-based material 14 is deposited on a Si-based substrate or on CMOS circuits 15 covered with a dielectric film 16 (silicon dioxide or silicone nitride). The dielectric layer is needed so that the amorphous layer does not disturb the Si crystaline or other structure of the substrate. Subsequently both (A) and (B) methods can be used to produce silicide waveguide regions 17. By using amorphous silicon-based material, the ease of integration is greatly improved.

Figure 5:
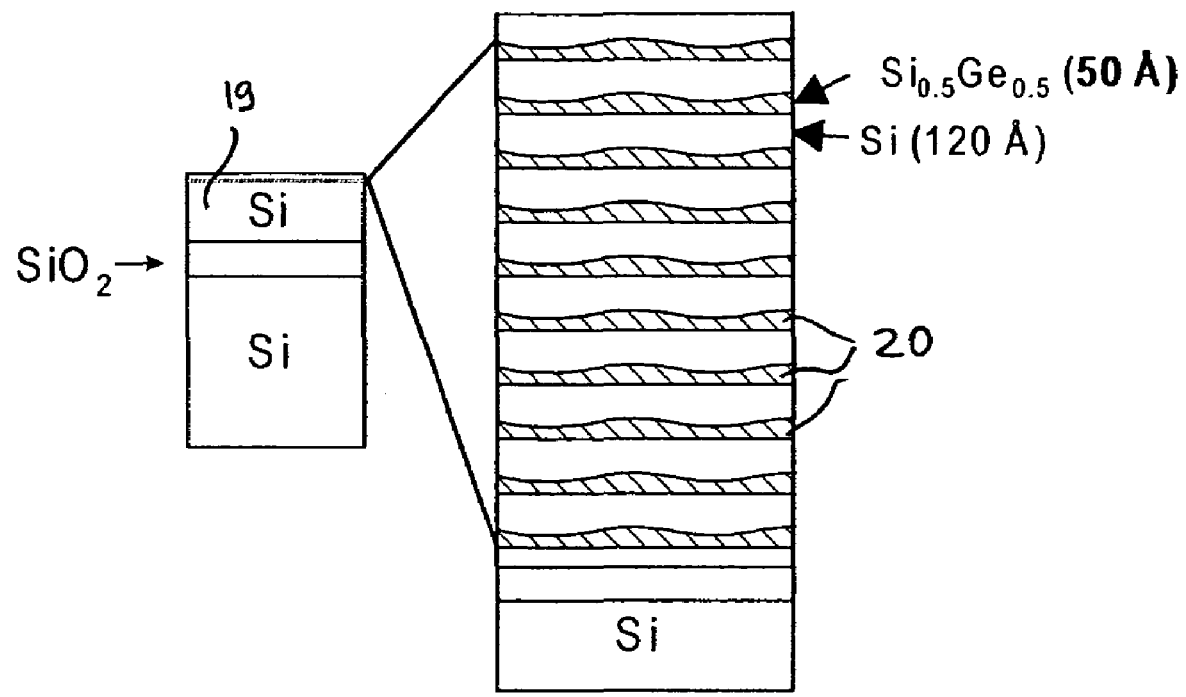
FIG. 5 is a cross-section view of a photodetector with a Si/SiGe based material layer structure.

It has been determined that certain metals can react with silicon germanium (SiGe) and form silicides under appropriate conditions. The use of SiGe to produce silicides makes photodetectors suitable for detecting longer wavelengths. If SiGe photodetectors can be demonstrated to operate in the 1.3–1.55 μm range, they will have major application in telecommunication networks. Both approaches described in (A) and (B) could be applied to SiGe materials. FIGS. 4a–b show the structures of the photodetector with Si/SiGe based material layer 18 before and after the silicidation process. SiGe material may be used as superlattices or as alloy. In FIG. 5 the Si/SiGe layer 19 shows a structure of epitaxially grown SiGe superlattices 20. Although the thickness of such structure is limited, it can provide longer wavelength absorption edge, and lower leakage current.

Figure 6:
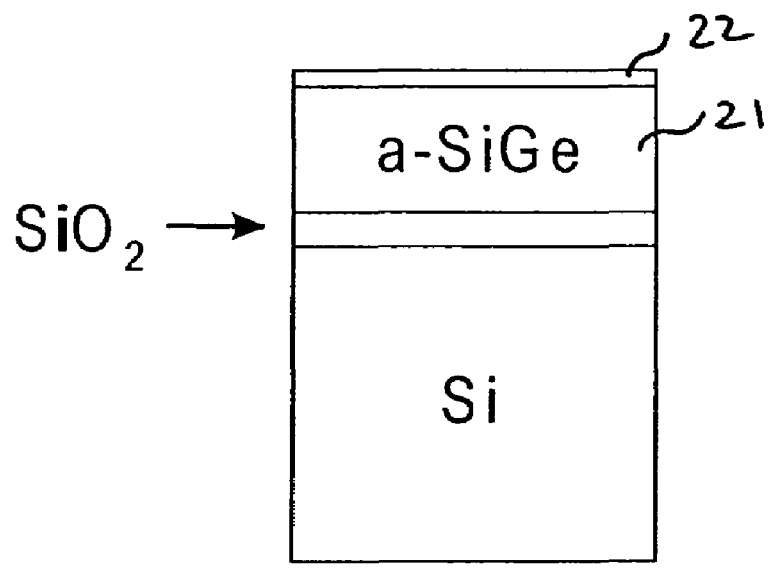
FIG. 6 is a cross-section view of a photodetector with an amorphous SiGe based layer material structure.

Amorphous silicon germanium material could also be used to produce silicides. Amorphous SiGe may exist as uniform SiGe alloy layer, which is easy to grow but gives higher leakage current. FIG. 6 shows a cross-section view of a photodetector with a layer of an amorphous SiGe alloy 21 with another layer of silicon 22.

The main metals used for silicidation processes for SiGe based materials are nickel and platinum. For both metals, the temperature required for silicidation is low enough (around 500° C.) not to deteriorate the strained SiGe layer quality. The application of other metals to form silicides has to be further researched.

Only standard VLSI technologies are required to fabricate the proposed photodetector devices, with very few process steps involved. The technology is also fully compatible with VLSI manufacturing. Proposed waveguide photodetector design is also more suitable for integration into fiber optic configurations.

The invention claimed is:

1. A photodetector comprising:
    two separated suicide regions on a substrate; and
    a waveguide of a silicon-based material having sidewalls, each sidewall being entirely and continuously in contact with one of the silicide regions, such that said sidewalls provide lateral confinement of the waveguide,
    wherein said two separated silicide regions serve as self-contained electrodes forming a Schottky contact with each sidewall of the waveguide, thereby imposing substantially a uniform electrical field that is localized in the waveguide.

2. The photodetector according to claim 1, wherein said silicon-based material is one of a group of materials comprising: silicon, amorphous silicon, silicon germanium, and amorphous silicon germanium.

3. The photodetector according to claim 1, wherein said two separated silicide regions are produced using a metal from a group of metals comprising: nickel, platinum, tungsten, and cobalt.

4. The photodetector according to claim 1, wherein said photodetector has a tapered input waveguide.

5. The photodetector according to claim 1, wherein said waveguide is located on said substrate.

* * * * *